United States Patent [19]

Lacruche

[11] Patent Number: 4,724,473
[45] Date of Patent: Feb. 9, 1988

[54] MICROPACKAGE FOR ENCAPSULATING AN ELECTRONIC COMPONENT

[75] Inventor: Bernard Lacruche, Chelles, France

[73] Assignee: Thomson-CSF, Paris, France

[21] Appl. No.: 799,570

[22] Filed: Nov. 21, 1985

Related U.S. Application Data

[63] Continuation of Ser. No. 561,564, Dec. 15, 1983, abandoned.

[30] Foreign Application Priority Data

Dec. 17, 1982 [FR] France .................. 82 21229

[51] Int. Cl.⁴ ...................... H01L 23/02; H01L 23/12
[52] U.S. Cl. ...................................................... 357/74
[58] Field of Search .......... 339/275 R, 275 B, 275 T; 357/74, 75, 79, 80

[56] References Cited

U.S. PATENT DOCUMENTS 4,345,814 8/1982 Gutbier et al. .............. 339/275 R

OTHER PUBLICATIONS

Japanese Patent Abstracts, vol. 5, No. 117 (E-67) (789), 28, Jul. 1981; & JP-A-56 56655 (Hitachi Seisakusho K.K.) 18.05.1981.
IBM Technical Disclosure Bulletin, vol. 25, No. 4, Sept. 1982, pp. 1934–1935, New York, U.S., E. Barkhuff et al.: "Attachment Method for Chip Carriers".

*Primary Examiner*—William L. Sikes
*Assistant Examiner*—Robert E. Wise
*Attorney, Agent, or Firm*—Oblon, Fisher, Spivak, McClelland, & Maier

[57] ABSTRACT

A micropackage (1) for encapsulating an electronic component (5), includes a body fitted with a plurality of external connection tabs (2) which pass underneath the body (at 3) and which terminate in tips (17) located underneath the body. The body is made of a material which is not wettable by solder (e.g. plastics or ceramics). At least one groove (15) is formed in the underside of the body in the proximity of said tips (17). The, or each, groove is filled with solder (16) in contact with the tips. This enables the micropackage to be placed on an interconnection substrate (8) having a pattern of conductive tracks (10) matching the external connection tabs (2), and to be soldered thereto by melting the solder so that it is drawn along the tabs by capillarity to occupy the spaces (18) around the points (3) where the tabs (2) touch the tracks (10).

4 Claims, 5 Drawing Figures

MICROPACKAGE FOR ENCAPSULATING AN ELECTRONIC COMPONENT

This application is a continuation of application Ser. No. 561,564, filed on Dec. 15, 1983, now abandoned.

The present invention relates to micropackages for electronic components, such packages including a plurality of solder tabs for making electrical connections thereto, with the tabs extending over portions of the underside of the package.

BACKGROUND OF THE INVENTION

The tabs may be cut out from a metal foil to form a web which is then folded round the edges of the package to extend underneath it. This is commonly the case for integrated circuits which are encapsulated in plastic or ceramic packages. Alternatively, the tabs may be deposited on the package by silk screen printing or by vacuum or electrolytic metalization, as is the case for so-called "chip carrier" type ceramic micropackages. In either case, the present invention is only applicable to packages in which the body material of the package is not wettable by solder (and in particular the invention is thus generally not applicable to metal-bodied packages). The invention is also not applicable to packages from which the connection tabs project in the form of pins suitable for being received in holes in a substrate. Such packages include many discrete components such as transistors, and also integrated circuits in DIL packages, for example.

Fixing such a pin-less package on an electric circuit substrate is difficult because of the accuracy required by the very small size of the tabs and by their close proximity to one another, together with the lack of positive location of the kind that pins could provide. Such a package must initially be held in place by having its body glued to the substrate, and then the connections are soldered by melting a layer of solder which has previously been deposited on the conductive tracks. Unfortunately, there is a conflict between the requirement that the package be held in place by glue prior to soldering, and the need for the package to move slightly to bring its tabs into direct contact with the tracks on the substrate when the solder melts. Further, the solder is not always evenly deposited with uniform thickness which can result in some adjacent pairs of contacts being short circuited while others are left open circuit since they are supported on either side by solder deposits of excessive thickness.

Preferred embodiments of the present invention mitigate the drawbacks outlined above.

SUMMARY OF THE INVENTION

The present invention provides a micropackage for encapsulating an electronic component, said micropackage including a body fitted with a plurality of external connection tabs which pass underneath said body and which terminate in tips located underneath said body, said body being made of a material which is not wettable by solder, the improvement wherein at least one groove is formed in the underside of said body in the proximity of said tips, said at least one groove being filled with solder in contact with said tips, thereby enabling said micropackage to be placed on an interconnection substrate having a pattern of conductive tracks matching said external connection tabs, and to be soldered thereto by melting said solder.

Thus, the above-mentioned drawbacks are countered by providing a length of solder wire or paste in a groove in the underside of the package. The micropackage with its prepared solder is thus glued to a substrate, and then the solder is melted in conventional manner by injecting the necessary heat: e.g. by passing through an oven, vapour phase soldering, hot air blast soldering, ... etc. The solder melts and it is drawn by capillarity along the tabs until it reaches a point of contact between a tab and the corresponding metal track. The solder is then trapped at the points of contact because capillarity is at a maximum there. After cooling the micropackage is soldered to the substrate and the length of solder which was originally in the groove is split into as many independent solder points as there are external connections to the package.

BRIEF DESCRIPTION OF THE DRAWINGS

Embodiments of the invention are described by way of example with reference to the accompanying drawings, in which.

MORE DETAILED DESCRIPTION

Micropackages in accordance with the invention can be used to encapsulate numerous types of circuit or component including integrated circuit chips, transistors or other components. The circuits or components thus encapsulated are then generally assembled into larger packages which encapsulate more complex circuits including a plurality micropackages. The specific example of the present invention described below concerns the encapsulation of an integrated circuit having connection tabs all round the micropackage. It should nevertheless be understood that the invention is equally applicable to encapsulating circuits that need connection tabs along one or two sides of the micropackage only. However, the present trend is towards integrated circuits requiring ever greater numbers of connection tabs, and thus leading to the tabs being close together and difficult to solder. The invention is thus described as applied to a micropackage having forty-four connection tabs, for example, rather than one having only three connection tabs as would be the case with a transistor for use in a hybrid circuit.

Figure 1:
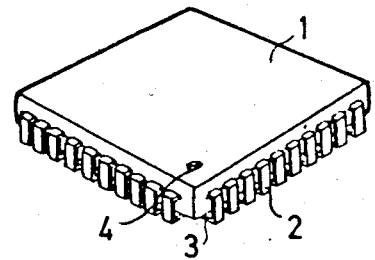
FIG. 1 is a perspective view of a micropackage having contact tabs which are folded under in the conventional manner.

FIG. 1 is a perspective view of a prior art micropackage having folded under connection tabs. The micropackage shown in FIG. 1 comprises a generally flat rectangular body 1 encapsulating an integrated circuit chip. A plurality of metal connection tabs 2 project from the narrow sides of the body and are folded under the body at 3 to constitute a contact-making area on its underside. The connection tabs 2 as shown in FIG. 1 are obtained by cutting out a web from a metal foil (e.g. by chemical etching or by stamping) and the integrated circuit chip is fixed to the web. Once the chip is encapsulated, the connection tabs 3 are folded under the body 1. A reference mark 4 distinguishes on corner of the body from the others and enables the micropackage to be correctly oriented before connection in a larger circuit.

The micropackage described above is made of plastic and has its connection tabs made from a web cut out from a metal foil. Similar micropackages are made from ceramics, in which case the connection tabs are generally silk screened or vacuum evaporated onto the sides and portions of the bottom surface of the ceramic body: such micropackages are sometimes known as "chip carriers".

Whether they are made of plastics or of ceramics material, such micropackages are becoming more and more widespread because of the disproportion which exists between the size of an integrated circuit chip and the size of a conventional package having 40 to 60 or even more external connection pins. Plastic or ceramic micropackages enable the density of a complex electrical circuit to be considerably increased, but soldering their external connections to a substrate is made very difficult by the small size of the connection tabs and be the fact that they are very close together.

Figure 2:
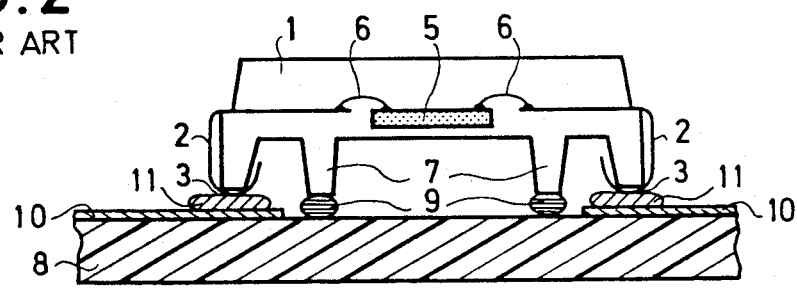
FIG. 2 is a cross section through a prior art plastics package showing the problems associated with soldering.

FIG. 2 is a cross section through the plastic micropackage shown in FIG. 1. In order to show up the difficulties of soldering the micropackage to a substrate, the vertical of the figure scale has been exaggerated relative to its horizontal scale.

The body 1 is shown sectioned through the middle to include the chip 5 of the integrated circuit in the figure. Some other component could alternatively be encapsulated in the micropackage. The encapsulated component is connected to the external connection tabs 2 by means of very fine gold or aluminum wires 6. The connection tabs 2 are located all round the body of the micropackage and they are folded under the body at 3 with their ends being received in a recess provided for the purpose of preventing the tabs snagging and risking being torn off. Several posts 7 project from the recess so that when the micropackage is placed on a substrate prior to soldering, it stands on the posts 7 and avoids crushing the tabs.

The electric circuit to which the micropackage is to be soldered comprises a substrate 8 which may be an epoxy printed circuit or a ceramic hybrid circuit, for example, or one of the more recent enamelled metal sheet substrates. In any event, the substrate 8 has at least one insulating surface on which electrical interconnection tracks are formed, eg. by deposition and etching. Two such tracks 10 are shown ending at respective connection tabs 2 of the micropackage.

Soldering such a micropackage to a substrate requires the following operations: firstly solder must be applied either to the tabs 2 or to the ends of the tracks 10 where they are to be connected to the tabs. FIG. 2 shows a deposit of solder 11 on the ends of the tracks 10 which may be formed by techniques such as silk screen printing a solder paste, by thickly tinning the ends of the tracks, or by flow soldering the tracks 10.

Secondly, the micropackage 1 must be accurately positioned relative to the conductor tracks 10. Because the tracks are so close together (centers at a pitch of 1/20-th of an inch or 1.27 mm), this is done by gluing the posts 7 to the substrate 8 by drops of glue 9.

Finally the solder is melted to complete the connection.

Unfortunately, the prior fixing by glue and the subsequent connection by means of solder can lead to difficulties. Firstly, the solder may not be sufficiently accurately placed on the substrate to avoid solder bridge short circuits, and secondly it may not be of sufficiently uniform thickness to ensure that solder contact is made to all of the connection tabs 2.

Figure 3:
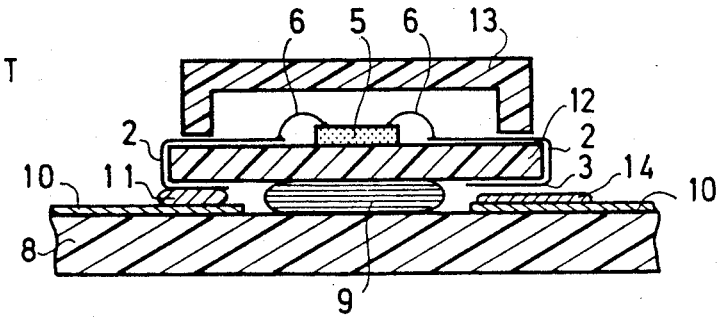
FIG. 3 is a cross section through a prior art ceramics package showing the problems associated with soldering.

FIG. 3 is a section through another type of micropackage having peripheral connection tabs folded under a body.

The differences between the micropackages shown in FIGS. 2 and 3 are fairly minimal. The FIG. 3 micropackage has a ceramic base 12 covered by a ceramic lid 13 to form a cavity in which a component 5 is encapsulated. The component is connected by gold wires 6 to external connection tabs 2. Instead of being in the form of metal foil tabs which are folded round the body 1, the tabs 2 in this case are constituted by metalization directly on the faces of the base 12. Metalization may be performed by silk screen printing or by vacuum deposition, for example. The tabs may be deposited directly as separate tabs, of the base surface may be metalized and the tabs subsequently etched from the metalization. In either case, the tabs do not project as pins suitable for being received in holes in a supporting substrate. Consequently the base needs to be fixed relative to the substrate by a drop of glue 9. Connection is performed in the same manner as for the FIG. 2 example, except that there is not even any residual flexibility of the tabs to assist making contact. In other words tabs deposited on a ceramic base are as rigid as the base, while metal foil tabs foiled round a plastic body can move a little. The left hand side of FIG. 3 shows a good solder connection while the right hand side shows an open circuit connection caused by the solder deposit 14 not being thick enough to meet the ceramic base. Deposits of solder on either side of the deposit 14 are thicker and make connection by wetting the corresponding tabs, while the thin deposit failed to make initial contact with a tab and simply spread out, wetting the track only.

Figure 4:
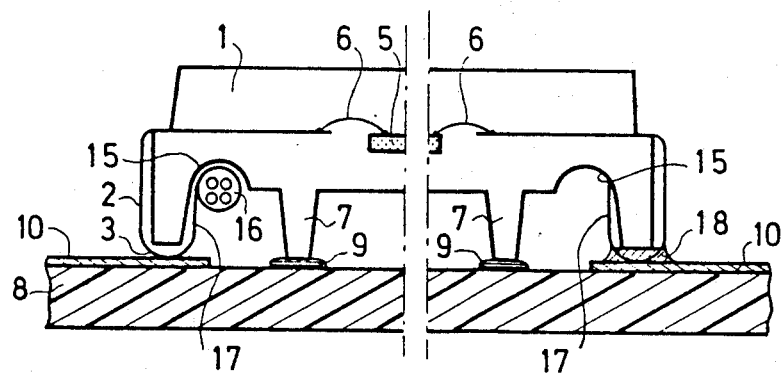
FIG. 4 is a cross section through a plastics package in accordance with the invention, with the left hand side of the figure showing the structure before soldering and the right hand side showing the structure after soldering.

FIG. 4 is a section through a micropackage in accordance with the invention, with the left hand side of the figure showing the micropackage before soldering and with the right hand side showing the micropackage after soldering.

The example chosen to illustrate the invention is a plastic bodied micropackage, but the invention is equally applicable to a ceramic bodied micropackage, the only difference lying in the resilience or lack of resilience of the connection tab.

In accordance with the invention, the body 1 of the micropackage has a groove 15 located in its lower surface, ie. the surface facing the substrate to which it is to be soldered. The groove 15 is made in the thickness of the micropackage material and is located in the immediate proximity of the folded-back tips of the connection tabs 2. Depending on the shape of the micropackage and on the disposition of its external connection tabs, the groove may be in the form of a peripheral loop or it may be in the form of one or more disjoint portions, e.g. if there are connection tabs along two sides only of the micropackage. Solder 16 is disposed in the groove 15, e.g. in the form of commercially available solder wire, or in the form of a solder paste of the kind used in silk screen printing. Regardless of the form of solder used, it is important for it to be in contact with the tips 17 of the connection tabs 2 where they pass underneath the micropackage. During the subsequent soldering operation, once the solder has reached its melting point, it is necessary for the molten solder to be in contact with the external connection tab metal in order to ensure that the solder is drawn by capilliarity to the region 3 where the tab is in contact with the track 10 to which it is to be soldered. The left hand side of FIG. 4 shows the solder 16 before soldering where it fills the groove 15, while the right hand portion shows the solder at 18 making contact between the tab 2 and the track 10, with the groove 15 empty of solder.

When the solder melts, the metal, or more particularly the alloy, splits into droplets, one on each connection tab tip 17 because the tips are metal and thus wettable, whereas the surrounding plastic (or ceramic) is not wettable. This means that the solder runs off the non-wettable material and thus avoids short circuits.

It is thus essential for the present invention that the underside of the micropackage is not wettable by molten solder. That is why the invention is essentially applicable to micropackages made of plastics or of ceramics materials. Fortunately these are the materials from which low bulk, multipleconnection circuit micropackages are almost always made.

FIG. 4 also shows that the micropackage may be positioned relative to the electric circuit, ie. relative to the substrate 8 and to the tracks 10 by drops of glue 9. The curved portions 3 of the connection tabs 2 where they pass under the body are in contact with the tracks 10. The conflict between fixing by glue and the need to bring the tabs into contact with the tracks as explained with reference to FIG. 2 is much reduced: firstly there is no danger of varying thicknesses of tinning on the tracks or on the tabs, so proper positioning can be obtained at the gluing stage, and secondly any subsequent movement that may be required is performed by the solder rather than by the micropackage.

Figure 5:
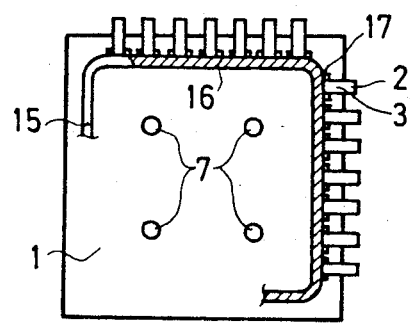
FIG. 5 is a bottom view of a micropackage in accordance with the invention.

FIG. 5 is a partial view of the underside of the FIG. 4 micropackage. The groove 15 can be seen to run around the perimeter of the micropackage since it has connection tabs on all sides. The loop of solder 16 located in the groove 15 is in contact with the tips 17 of all of the connection tabs 2.

One of the advantages of the invention is that it enables the solder to be selected as a function of conditions such as the nature of the metals to be soldered together, or the manner in which heat is applied to melt the solder, each by passage through an oven filled with hot air or with hot vapor. This choice can be exercised by selecting a suitable solder wire from the wide range of solder wires available, or by mixing a suitable solder paste. Further, the invention enables the amount of solder used to be accurately determined. The groove 15 can be filled with a quantity of solder adapted to the number and to the size of the connections to be made. This greatly reduces irregularities that are a problem in the prior art. Finally, since the molten solder moves under the effect of capillarity, the problems associated with ill placed solder due to inaccurate silk screen printing, for example, are eliminated. The solder point geometry obtained using a micropackage in accordacne with the invention is thus constant, reproducible, and free from short circuits between adjacent connection tabs.

Finally, for circuit such as MOS circuits which are vulnerable to static electricity, the length of solder 16 keeps all the connection tabs short circuited together right up to the moment the circuit is soldered in place on a substrate. This provides very good protection against damage by accidental static electricity discharges.

Naturally, although the invention as described above with reference to specific examples of integrated circuit chips requiring a multiplicity of external connections, the invention is just as applicable to other micropackages encapsulating any type of component, even if LSI numbers of connections are not required. The invention is based on the solder being accurately placed where needed by virtue of capillarity causing the solder to move, without needing the micropackage to move.

I claim:

1. A micropackage for encapsulating an electronic component, said micropackage including a body fitted with a plurality of external connection tabs which terminate in tips located underneath said body, said body being made of a material which is not wettable by solder, wherein:

at least one groove is formed in the underside of said body, in the proximity of said tips, said at least one groove being filled with solder in contact with said tips, said solder constituting when located in said groove a short circuit between said tips of said contact tabs, thereby protecting the circuit encapsulated inside the micropackage from static electricity, and after heating constituting a reserve of metal enabling said micropackage to be soldered on an interconnection substrate having a pattern of conductive tracks, by melting said solder.

2. A micropackage according to claim 1, wherein said tabs are soldered to said substrate tracks by the molten solder being drawn along said tabs by capillarity from said tips to establish soldered connections between said tabs and corresponding ones of said tracks.

3. A micropackage according to claim 1, wherein said solder is located in said groove in the form of a length of solder wire.

4. A micropackage according to claim 1, wherein said solder in said groove is constituted by a filling of solder paste.

* * * * *